(12) United States Patent
Lin et al.

(10) Patent No.: US 8,884,665 B2
(45) Date of Patent: Nov. 11, 2014

(54) MULTIPLE-PHASE CLOCK GENERATOR

(75) Inventors: Chih-Chang Lin, San Jose, CA (US); Chan-Hong Chern, Palo Alto, CA (US); Ming-Chieh Huang, San Jose, CA (US); Tao Wen Chung, Zhubei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 150 days.

(21) Appl. No.: 13/084,817

(22) Filed: Apr. 12, 2011

(65) Prior Publication Data

US 2012/0262212 A1 Oct. 18, 2012

(51) Int. Cl.
*H03B 19/00* (2006.01)
*H03K 5/15* (2006.01)

(52) U.S. Cl.
CPC .................. *H03K 5/15013* (2013.01)
USPC ............ 327/117; 327/115; 327/164; 327/245

(58) Field of Classification Search
CPC ..... G11C 7/222; H03K 23/68; H03K 23/667; H03B 19/00
USPC .................. 327/115, 117, 164, 245
See application file for complete search history.

(56) References Cited

U.S. PATENT DOCUMENTS

| | | | |
|---|---|---|---|
| 2007/0052457 A1* | 3/2007 | Thewes et al. | 327/115 |
| 2008/0018367 A1* | 1/2008 | Bazes | 327/117 |
| 2011/0025381 A1* | 2/2011 | Yamahira | 327/115 |

* cited by examiner

*Primary Examiner* — John Poos
(74) *Attorney, Agent, or Firm* — Lowe Hauptman & Ham, LLP

(57) ABSTRACT

A multiple-phase clock generator includes at least one stage of dividers. A clock signal is supplied as a first stage clock input to dividers in a first stage of dividers. An N-th stage includes $2^N$ dividers, where N is a positive integer number. Each divider in the first stage is configured to divide a first clock frequency of the first stage clock input by 2 to provide a first stage output. Each divider in the N-th stage is configured to divide an N-th clock frequency of an N-th stage clock input by 2 to provide an N-th stage output. The N-th stage outputs from the dividers in the N-th stage provide $2^N$-phase clock signals that are equally distributed with a same phase difference between adjacent phase clock signals.

20 Claims, 3 Drawing Sheets

US 8,884,665 B2

MULTIPLE-PHASE CLOCK GENERATOR

TECHNICAL FIELD

The present disclosure relates generally to an integrated circuit and more particularly a multi-phase clock generator.

BACKGROUND

A multiple-phase clocks generator using a phase-locked loop (PLL) or delay-locked loop (DLL) has a relatively large size compared with other circuits in an integrated circuit. Furthermore, the PLL or DLL implementation to generate the multiple-phase clocks is complicated and expensive.

BRIEF DESCRIPTION OF THE DRAWINGS

Reference is now made to the following descriptions taken in conjunction with the accompanying drawings, in which.

DETAILED DESCRIPTION

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

Figure 1:
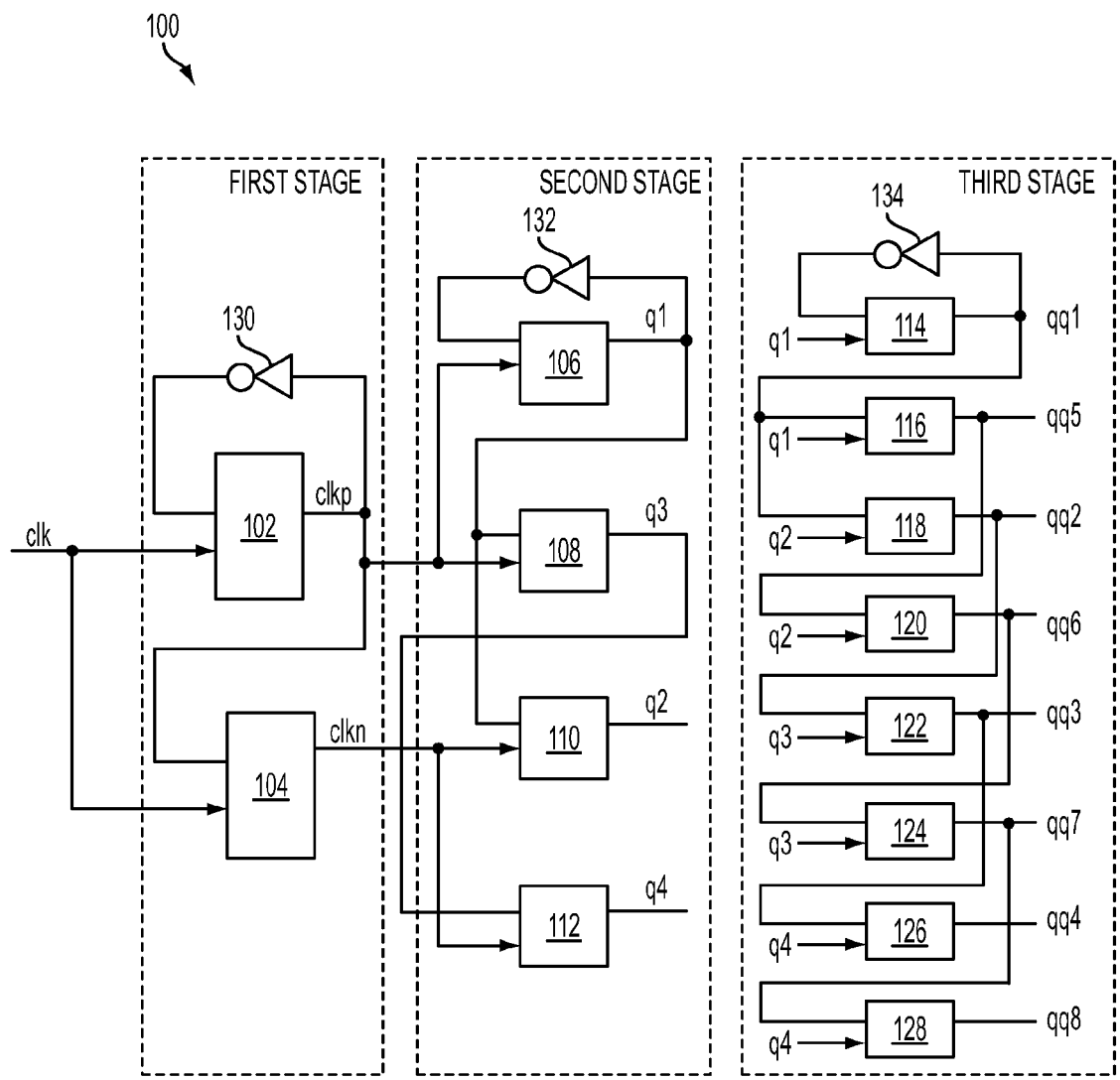
FIG. 1 is a schematic diagram showing an exemplary multiple-phase clock generator according to some embodiments.

FIG. 1 is a schematic diagram showing an exemplary multiple-phase clock generator according to some embodiments. The multiple-phase clock generator 100 includes flip-flops 102, 104, 106, 108, 110, 112, 114, 116, 118, 120, 122, 124, 126, and 128. The flip-flops 102, 104, 106, 108, 110, 112, 114, 116, 118, 120, 122, 124, 126, and 128 function as dividers, as the inputs to the flip-flops are driven by the output of another flip-flop or by their own outputs through inverters 130, 132, and 134 in the same stage (i.e., in the same column). Thus, these dividers are synchronous and correlated.

The dividers implemented by the flip-flops 102, 104, 106, 108, 110, 112, 114, 116, 118, 120, 122, 124, 126, and 128 may use different types of flip-flops for different embodiments, as long as they are triggered by a clock signal. For example, a high-speed current mode latch can be used as the flip-flop for a high-speed application.

Figure 2:
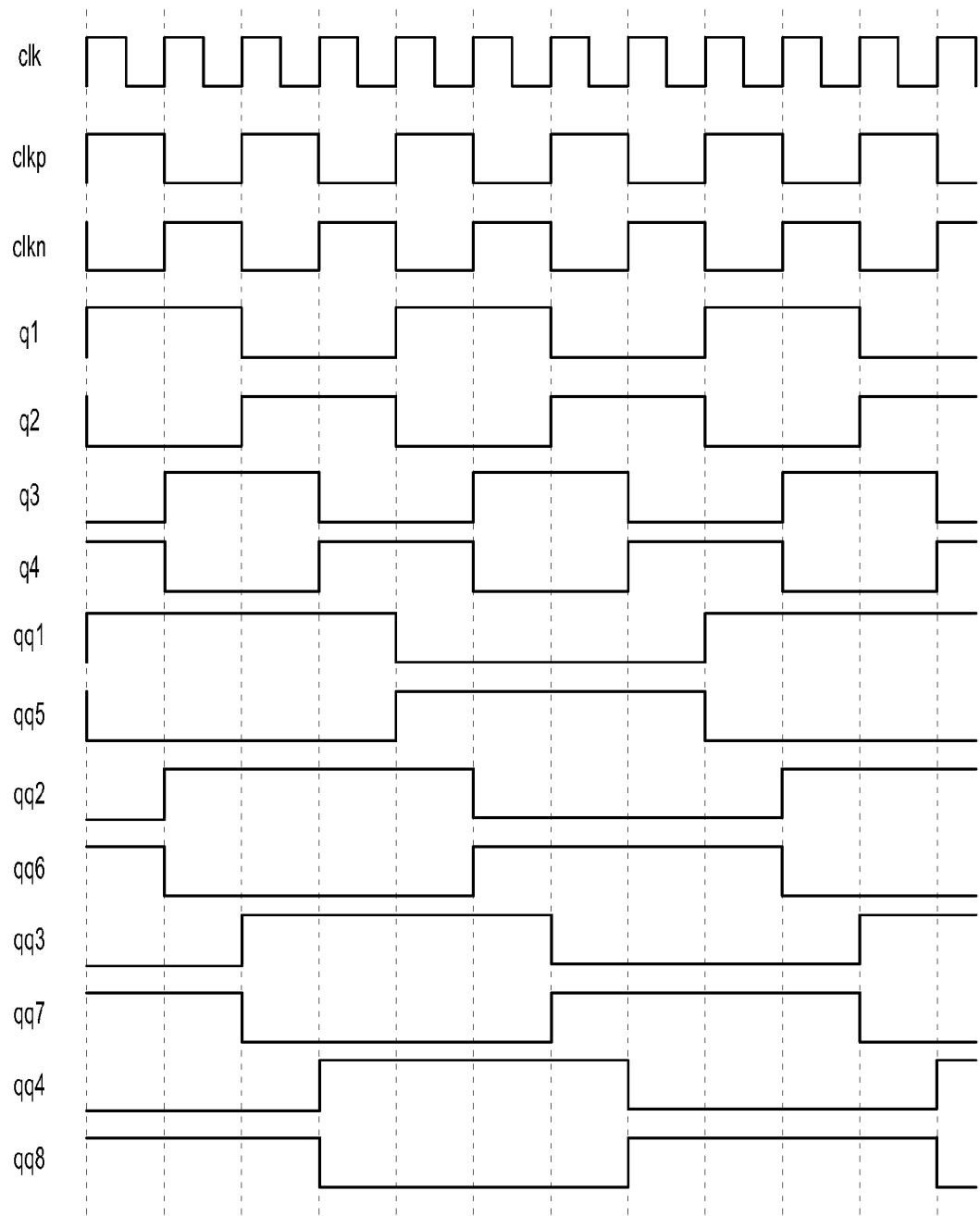
FIG. 2 is a plot showing waveforms of the exemplary multiple-phase clock generator in FIG. 1 according to some embodiments.

FIG. 2 is a plot showing waveforms of the exemplary multiple-phase clock generator in FIG. 1 according to some embodiments. The multiple-phase clock generator 100 is described below with reference to the waveforms in FIG. 2. A single clock input signal clk is supplied as inputs to the first stage flip-flops (dividers) 102 and 104. In general, an N-th stage dividers includes $2^N$ dividers in similar embodiments. The flip-flop 102 has its output clkp coupled to the input of the flip-flop 104, and also to the input of the flip-flop 102 itself through the inverter 130. The output clkp is also coupled to the clock inputs of the flip-flops 106 and 108 at the next stage. The flip-flop 104 has its output clkn coupled to the clock inputs of the flip-flops 110 and 112 at the next stage.

Because the inverter 130 changes the input signal to the flip-flop 102 from the output signal clkp, the clkp oscillates between a logical 1 and a logical 0. As the clk signal oscillates (alternates) between a logical 1 and a logical 0 (as shown in FIG. 2) at a clock frequency F_clk, the clkp signal oscillates at half the frequency $F\_clkpn=\frac{1}{2}*F\_clk$, because the clkp output of the flip-flop 102 holds its value until the next cycle of the clock input signal clk. (The flip-flops are assumed to be positive-edge triggered in this example.)

The clkn signal also oscillates at the frequency $F\_clkpn=\frac{1}{2}*F\_clk$, because the clkn output of the flip-flop 104 holds its value until the next cycle of the clock input signal clk. Because the input to the flip-flop 102 is inverted by the inverter 130 and the input to the flip-flop 104 is not inverted, the output signals of the flip-flops 102 and 104 are complementary (inverted). The first stage outputs clkp and clkn are two-phase clock signals.

Similarly, the second stage flip-flops (dividers) 106, 108, 110, and 112 have their output signals q1, q2, q3, and q4 at half the frequency of their clock input frequency, i.e., F_clkpn. Therefore, the frequency F_q of signals q1, q2, q3, and q4 is: $F\_q=\frac{1}{2}*F\_clkpn=\frac{1}{4}*F\_clk$. The signals q1 and q3 are complements of each other because of the inverter 132. The signals q2 and q4 are complements of each other, because their inputs from q1 and q3 are complements of each other. The flip-flops 106 and 108 are triggered by clkp, and the flip-flops 110 and 112 are triggered by clkn, which is a complement of clkp. Therefore, signals q2 and q4 are triggered at the next clock cycle of the clock signal clk's positive-edge (at the positive edge of clkn instead of the positive edge of clkp) compared to the signals q1 and q3. The second stage outputs q1, q2, q3, and q4 are four-phase clock signals.

Similarly, the third stage flip-flops (dividers) 114, 116, 118, 120, 122, 124, 126, and 128 have their output signals qq1, qq2, qq3, qq4, qq5, qq6, qq7, and qq8 at half the frequency of their clock input frequency, i.e., F_q. Therefore, the frequency F_qq of signals qq1, qq2, qq3, qq4, qq5, qq6, qq7, and qq8 is: $F\_qq=\frac{1}{2}*F\_q=\frac{1}{4}*F\_clkpn=\frac{1}{8}*F\_clk$. In general, an N-th stage dividers have outputs with a frequency $F\_N=\frac{1}{2^N}*F\_clk$ in similar embodiments.

The signals qq1 and qq5 are complements of each other because of the inverter 134. The signals qq2 and qq6 are complements of each other, because their inputs from qq1 and qq5 are complements of each other. The signals qq3 and qq7 are complements of each other, because their inputs from qq2 and qq6 are complements of each other. The signals qq4 and qq8 are complements of each other, because their inputs from qq3 and qq7 are complements of each other.

The flip-flops 114 and 116 are triggered by q1, and the flip-flops 118 and 120 are triggered by q2, which has one clock cycle delay of the clock signal clk compared to q1. Therefore, signals qq2 and qq6 are triggered at the next clock cycle of the clock signal clk compared to the signals qq1 and qq5. Similarly, signals qq3 and qq7 are triggered at the next clock cycle of the clock signal clk compared to the signals qq2 and qq6. Also, signals qq4 and qq8 are triggered at the next clock cycle of the clock signal clk compared to the signals qq3 and qq7.

Therefore, the eight output clock phases of qq1, qq2, qq3, qq4, qq5, qq6, qq7, and qq8 are equally distributed with the same amount of phase difference, e.g., one clock cycle of the clock signal clk, between adjacent clocks phases. The third stage outputs qq1, qq2, qq3, qq4, qq5, qq6, qq7, and qq8 are eight-phase clock signals. Even though a 3-stage structure is shown in FIG. 1, any positive integer number of stages, e.g., 1, 2, 3, 4, . . . , can be used in other embodiments of the multiple-phase clock generator 100. The multiple-phase clock generator 100 can be used in circuits such as a clock recovery circuit.

The multiple-phase clock generator 100 is simple and easily implemented compared to either a PLL or DLL. For example, one exemplary PLL uses a multiple stage ring oscillator. The ring oscillator output is divided by a frequency divider (by M), feedback to compare to a reference clock in a phase frequency detector. A control signal is generated based on the comparison to control a charge pump that is coupled to the ring oscillator through a low pass filter. Once locked, the voltage controlled oscillator (VCO) frequency is equivalent to a specified number M times of a reference clock frequency. If there are four differential stages in the ring oscillator, there will be eight clock phases in the VCO output. Compared to this PLL circuit, the multiple-phase clock generator 100 is implemented mainly using only multiple sequences (stages) of dividers, e.g., flip-flops and inverters.

Figure 3:
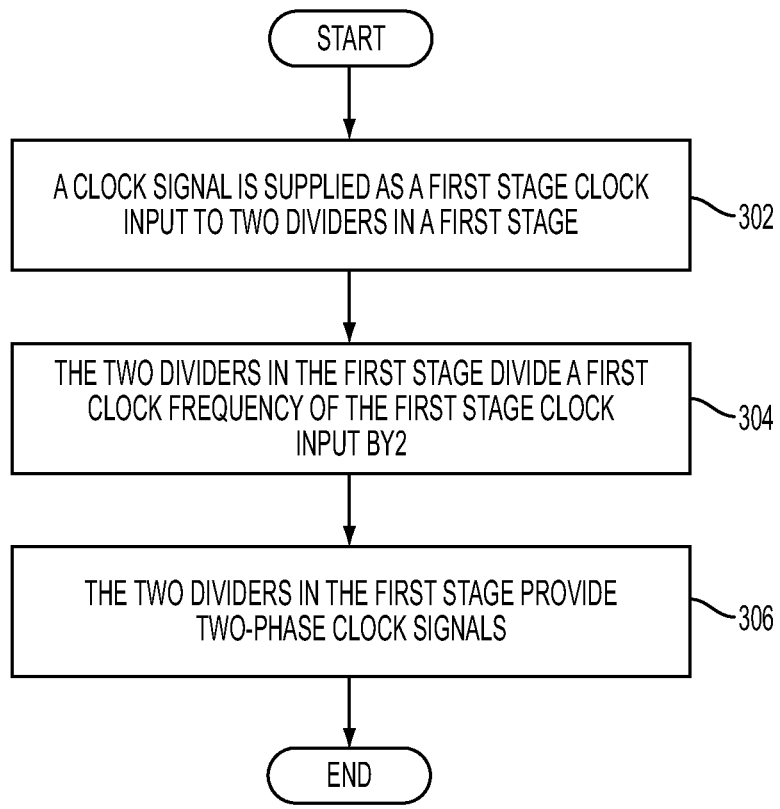
FIG. 3 is a flowchart for a method of generating multiple-phase clocks using the exemplary multiple-phase clock generator in FIG. 1 according to some embodiments.

FIG. 3 is a flowchart for a method of generating multiple-phase clocks using the exemplary multiple-phase clock generator in FIG. 1 according to some embodiments. At step 302, a clock signal is supplied as a first stage clock input to two dividers in a first stage. At step 304, the two dividers in the first stage divide a first clock frequency of the first stage clock input by 2. At step 306, the two dividers in the first stage provides two-phase clock signals.

In various embodiments, each divider in an N-th stage divides an N-th clock frequency of an N-th stage clock input by 2 to provide an N-th stage output, where the N-th stage includes $2^N$ dividers and N is a positive integer number greater than 1. The N-th stage outputs from the dividers in the N-th stage provide $2^N$-phase clock signals that are equally distributed with a same phase difference between adjacent phase clock signals. The N-th stage output has an N-th output frequency that is $\frac{1}{2^N}$ times of the first clock frequency. An (N−1)th stage output provides the N-th stage clock input. The phase difference is one clock cycle of the clock signal.

In various embodiments, the dividers comprise flip-flops. A first N-th stage output of a first flip-flop in the N-th stage is coupled to an inverter. The inverted first N-th stage output is coupled from the inverter to a first input of the first flip-flop. The first N-th stage output of the first flip-flop in the N-th stage is coupled to a second input of a second flip-flop in the N-th stage and to a third input of a third flip-flop in the N-th stage. A second N-th stage output of the second flip-flop in the N-th stage is coupled to a fourth input of a fourth flip-flop in the N-th stage.

According to some embodiments, a multiple-phase clock generator includes at least one stage of dividers. A clock signal is supplied as a first stage clock input to dividers in a first stage of dividers. An N-th stage includes $2^N$ dividers, where N is a positive integer number. Each divider in the first stage is configured to divide a first clock frequency of the first stage clock input by 2 to provide a first stage output. Each divider in the N-th stage is configured to divide an N-th clock frequency of an N-th stage clock input by 2 to provide an N-th stage output. The N-th stage outputs from the dividers in the N-th stage provide $2^N$-phase clock signals that are equally distributed with a same phase difference between adjacent phase clock signals.

According to some embodiments, a method of generating multiple-phase clock signals includes supplying a clock signal as a first stage clock input to two dividers in a first stage. The two dividers in the first stage divide a first clock frequency of the first stage clock input by 2. The two dividers in the first stage provide two-phase clock signals.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within scope of the disclosure and will be apparent to those skilled in the art after reviewing this disclosure.

What is claimed is:

1. A multiple-phase clock generator, comprising:
   at least one stage of dividers,
   wherein an N-th stage of the at least one stage of dividers includes $2^N$ dividers, N is a positive integer number, each divider in a first stage of the at least one stage of dividers is configured to divide a first clock frequency of a first stage clock input by 2 to provide a first stage output, each divider in the N-th stage is configured to divide an N-th clock frequency of an N-th stage clock input by 2 to provide an N-th stage output, and the N-th stage is configured to output from the dividers in the N-th stage $2^N$ phase clock signals that are equally distributed with a same phase difference between adjacent phase clock signals.

2. The multiple-phase clock generator of claim 1, wherein the N-th stage output has an N-th output frequency that is $\frac{1}{2^N}$ times of the first clock frequency.

3. The multiple-phase clock generator of claim 1, wherein N is at least 2, and the N-th stage clock input is provided by an (N-1)th stage output.

4. The multiple-phase clock generator of claim 1, wherein the phase difference is one clock cycle of the clock signal.

5. The multiple-phase clock generator of claim 1, wherein the dividers comprise flip-flops.

6. The multiple-phase clock generator of claim 5, further comprising at least one inverter wherein a first flip-flop in the N-th stage has a first N-th stage output coupled to a corresponding inverter of the at least one inverter.

7. The multiple-phase clock generator of claim 6, wherein the corresponding inverter is coupled to a first input of the first flip-flop.

8. The multiple-phase clock generator of claim 7, wherein the first N-th stage output of the first flip-flop in the N-th stage is coupled to a second input of a second flip-flop in the N-th stage.

9. The multiple-phase clock generator of claim 8, wherein the first N-th stage output of the first flip-flop in the N-th stage is coupled to a third input of a third flip-flop in the N-th stage, when N is at least 2.

10. The multiple-phase clock generator of claim 9, wherein a second N-th stage output of the second flip-flop in the N-th stage is coupled to a fourth input of a fourth flip-flop in the N-th stage when N is at least 2.

11. A method of generating multiple-phase clock signals, comprising:
supplying a clock signal as a first stage clock input to two dividers in a first stage of at least one stage of dividers;
the two dividers in the first stage dividing a first clock frequency of the first stage clock input by 2; and
the two dividers in the first stage providing two-phase clock signals.

12. The method of claim 11, further comprising:
each divider in an N-th stage of the at least one stage of dividers dividing an N-th clock frequency of an N-th stage clock input by 2 to provide an N-th stage output, wherein the N-th stage includes $2^N$ dividers, and N is a positive integer number greater than 1; and
the N-th stage outputs from the dividers in the N-th stage providing $2^N$-phase clock signals that are equally distributed with a same phase difference between adjacent phase clock signals.

13. The method of claim 12, wherein the N-th stage output has an N-th output frequency that is $\frac{1}{2}^N$ times of the first clock frequency.

14. The method of claim 12, further comprising an (N-1)th stage output providing the N-th stage clock input.

15. The method of claim 12, wherein the phase difference is one clock cycle of the clock signal.

16. The method of claim 12, wherein the dividers comprise flip-flops.

17. The method of claim 16, further comprising:
coupling a first N-th stage output of a first flip-flop in the N-th stage to an inverter; and
coupling the inverted first N-th stage output from the inverter to a first input of the first flip-flop.

18. The method of claim 17, further comprising:
coupling the first N-th stage output of the first flip-flop in the N-th stage to a second input of a second flip-flop in the N-th stage and to a third input of a third flip-flop in the N-th stage.

19. The method of claim 18, further comprising coupling a second N-th stage output of the second flip-flop in the N-th stage to a fourth input of a fourth flip-flop in the N-th stage.

20. A multiple-phase clock generator, comprising:
at least one stage of flip-flops,
wherein an N-th stage includes $2^N$ flip-flops, N is a positive integer number greater than 1, each flip-flop in a first stage of the at least one stage of flip-flops is configured to divide a first clock frequency of a first stage clock input by 2 to provide a first stage output, each flip-flop in the N-th stage is configured to divide an N-th clock frequency of an N-th stage clock input by 2 to provide an N-th stage output, the N-th stage clock input is provided by an (N-1)th stage output, the N-th stage outputs from the flip-flops in the N-th stage provide $2^N$-phase clock signals that are equally distributed with a same phase difference between adjacent phase clock signals, and the phase difference is one clock cycle of the clock signal.

* * * * *